(12) United States Patent
Van Haren (10) Patent No.: US 8,115,938 B2
(45) Date of Patent: Feb. 14, 2012

(54) METHOD OF PROVIDING ALIGNMENT MARKS, DEVICE MANUFACTURING METHOD AND LITHOGRAPHIC APPARATUS

(75) Inventor: Richard Johannes Franciscus Van Haren, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 444 days.

(21) Appl. No.: 12/395,959

(22) Filed: Mar. 2, 2009

(65) Prior Publication Data

US 2009/0225331 A1  Sep. 10, 2009

Related U.S. Application Data

(60) Provisional application No. 61/064,408, filed on Mar. 4, 2008.

(51) Int. Cl.
*G01B 11/14* (2006.01)
(52) U.S. Cl. .................................. 356/614; 356/617
(58) Field of Classification Search .......... 356/600–640
See application file for complete search history.

(56) References Cited

U.S. PATENT DOCUMENTS

| | | | | |
|---|---|---|---|---|
| 5,216,257 A * | 6/1993 | Brueck et al. | ................. | 250/548 |
| 5,414,514 A * | 5/1995 | Smith et al. | .................... | 356/509 |
| 5,581,324 A * | 12/1996 | Miyai et al. | ...................... | 355/53 |
| 5,672,520 A * | 9/1997 | Natsume | ........................ | 356/401 |
| 5,757,507 A * | 5/1998 | Ausschnitt et al. | .......... | 356/401 |
| 5,846,678 A | 12/1998 | Nishigori et al. | | |
| 6,671,048 B1 * | 12/2003 | Leroux | ......................... | 356/401 |
| 7,098,992 B2 | 8/2006 | Ohtsuki et al. | | |
| 7,230,704 B2 * | 6/2007 | Sezginer et al. | ............. | 356/401 |
| 7,230,705 B1 * | 6/2007 | Yang et al. | .................... | 356/401 |
| 7,349,105 B2 * | 3/2008 | Weiss | ............................. | 356/620 |
| 7,804,582 B2 * | 9/2010 | Zaal et al. | ........................ | 355/72 |
| 7,933,015 B2 * | 4/2011 | Chiu et al. | .................... | 356/401 |
| 2003/0223630 A1 * | 12/2003 | Adel et al. | .................... | 382/145 |
| 2004/0137651 A1 | 7/2004 | Smedt et al. | | |
| 2004/0190008 A1 | 9/2004 | Mieher et al. | | |

(Continued)

FOREIGN PATENT DOCUMENTS

EP  0 906 590 B1  8/2003

(Continued)

OTHER PUBLICATIONS

Translation of Notice of Reasons for Rejection for Japanese Patent Application No. 2005-354000 mailed Apr. 8, 2009, 4 pgs.

(Continued)

*Primary Examiner* — Gregory J Toatley
*Assistant Examiner* — Jarreas C Underwood
(74) *Attorney, Agent, or Firm* — Sterne, Kessler, Goldstein & Fox P.L.L.C (57) ABSTRACT

A method of providing a set of alignment marks on a substrate including the following steps. Exposing a first pattern on at least one exposure area of a layer of a substrate, the first pattern comprising a repetitive set of elements having a first element size. Exposing a second pattern on the at least one exposure area on top of the first pattern, the second pattern comprising a repetitive set elements of a second element size, the second element size being larger or smaller than the first element size. The elements of the first and second patterns partly overlap and combined form a set of repetitive large-sized alignment marks, such that the edges of the alignment marks in the direction of repetition are formed by small-sized elements.

23 Claims, 8 Drawing Sheets

U.S. PATENT DOCUMENTS

| | | | |
|---|---|---|---|
| 2005/0286052 A1 | 12/2005 | Huggins et al. | |
| 2006/0250597 A1 | 11/2006 | Nakajima | |

FOREIGN PATENT DOCUMENTS

| | | |
|---|---|---|
| EP | 1 372 040 A2 | 12/2003 |
| JP | 62-280818 A | 12/1987 |
| JP | 04-303915 A | 10/1992 |
| JP | 06-232026 A | 8/1994 |
| JP | 08-179514 A | 7/1996 |
| JP | 09-199394 A | 7/1997 |
| JP | 2000-338531 A | 12/2000 |
| JP | 2001-085306 A | 3/2001 |
| JP | 2001-189256 A | 7/2001 |
| JP | 2008-503897 A | 2/2008 |

OTHER PUBLICATIONS

Faria, J.A. Brandao, "Analysis of the Electro-optic Effect in Anisotropic Crystals with 2-mm and 3-m Point Group Symmetry Using a First-Order Perturbation Technique", John Wiley & Sons, Inc., Microwave and Optical Tehnology Letters, vol. 6, No. 14, Jun. 11, 1993, pp. 815-820.

English language Abstract of Japanese Patent Publication No. 62-280818 A, published Dec. 5, 1987, the Japanese Patent Office; 1 page.

English language Abstract of Japanese Patent Publication No. 08-179514 A, published Jul. 12, 1996, the Japanese Patent Office; 1 page.

English language Abstract of Japanese Patent Publication No. 09-199394 A, published Jul. 31, 1997, the Japanese Patent Office; 1 page.

English language Abstract of Japanese Patent Publication No. 2000-338531 A, published Dec. 8, 2000, the Japanese Patent Office; 1 page.

English language Abstract of Japanese Patent Publication No. 2001-085306 A, published Mar. 30, 2001, the Japanese Patent Office; 1 page.

English language translation of Japanese Notice of Reasons for Rejection directed to Patent Application No. 2005-354000, mailed Apr. 8, 2009 from the Japanese Patent Office; 4 pages.

English translation of Japanese Notice of Reasons for Rejection directed to related Japanese Patent Application No. 2009-043854, mailed Jul. 22, 2011 from the Japanese Patent Office; 3 pages.

* cited by examiner

*Prior Art*

METHOD OF PROVIDING ALIGNMENT MARKS, DEVICE MANUFACTURING METHOD AND LITHOGRAPHIC APPARATUS

CROSS REFERENCE TO RELATED APPLICATION

This application claims benefit under 35 U.S.C. §119(e) to U.S. Provisional Patent Application 61/064,408, filed Mar. 4, 2008, which is incorporated by reference herein in its entirety.

BACKGROUND

1. Field of the Invention

The present invention relates to a method of providing a set of alignment marks on a substrate, to a device manufacturing method and to a lithographic apparatus. The invention also relates to a method of determining the relative displacement of at least two layers provided with the alignment marks.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In general, the wafer is covered with a plurality of layers, placed on top of each other. In the layers patterns are exposed, wherein the pattern of a layer has to fit exactly on the previous one. In practice, there will always be an offset between consecutive layers. The offset or displacement of the layers relative to one another is referred to herein as the overlay error or overlay. The overlay is determined by one or more alignment sensors arranged to measure the positions of substrate alignment marks arranged for that purpose on the layers.

Several methods exist to determine the overlay capability of a lithographic apparatus. First, use can be made of one or more of the alignment sensors typically present in the lithographic apparatus. The alignment sensor measures the relative position of an alignment mark in a first layer with respect to the position of the same or similar alignment mark in a second layer, placed on top of the first layer. However, the overlay measurements rely on alignment marks or similar overlay targets with dimensions that are much larger than the typical product features to be provided on the substrate. Furthermore, the alignment sensors are designed for an accuracy that is much larger than the typical product features as well.

Alternatively, use may be made of separate metrology tool. For instance, the location of the outer box/frame in the first layer with respect to the location of the inner box in the second layer may be determined with the metrology tool. This method is relatively slow and involves removing the substrate from the lithographic apparatus after having provided the first layer on the substrate. Finally, the measurement of the overlay may be SEM tool based. The location of a set of lines in a first layer may be measured at resolution (i.e., with an accuracy having the same order of magnitude of the typical product features in the layer) with respect to the location of a second set of lines at resolution in a second layer. However, also this SEM tool based method is comparatively time consuming and complex (or even impossible) to accomplish when the first layer target is located in a product layer.

SUMMARY

Therefore, what is needed is a method and apparatus for providing accurate and high-quality alignment marks on a substrate.

What is also needed is a method and apparatus for providing alignments marks wherein the overlay error may be determined fast and with a high accuracy.

What is further needed is a method and apparatus for providing alignments marks wherein the overlay error may be determined at resolution.

According to an embodiment of the invention, there is a provided a method of providing a set of alignment marks on a substrate comprising the following steps. Exposing a first pattern on at least one exposure area of a layer of a substrate, the first pattern comprising a repetitive set of elements having a first element size. Exposing a second pattern on the at least one exposure area on top of the first pattern, the second pattern comprising a repetitive set elements of a second element size, the second element size being larger or smaller than the first element size. The elements of the first and second patterns partly overlap and combined form a set of repetitive large-sized alignment marks, such that the edges of the alignment marks in the direction of repetition are formed by small-sized elements.

According to another embodiment of the present invention, there is provided a method of calibrating a projection system of a lithographic apparatus comprising the following steps. When the projection system is in an initial condition, exposing a first pattern on at least one exposure area of a layer of a substrate, the first pattern comprising a repetitive set of small-sized elements and exposing a second pattern comprising a set of large-sized elements on the at least one exposure area on top of the first pattern, wherein the elements of the first and second patterns partly overlap and combined form a set of repetitive large-sized alignment marks, such that the edges of the alignment marks in the direction of repetition are formed by small-sized elements. When the projection system is in heated condition, repeating the exposure process. Determining information about the distortion of the alignment marks as function of the temperature of at least a portion of the projection system.

According to a further embodiment of the present invention, there is provided a method of determining the relative displacement of at least two layers provided with respective sets of alignment marks comprising the following steps. Producing a first set of combined alignment marks on a first layer and a complimentary, second set of combined alignment marks on a second layer, provided on top of the first layer. Irradiating the two sets of combined alignment marks. Detecting the relative displacement between the first and second sets of alignment marks.

According to yet another embodiment of the present invention, there is provided a device manufacturing method comprising transferring at least one pattern from a patterning device onto a substrate of the device comprising the following steps. Transferring a first pattern on at least one exposure area of a layer of a substrate, the first pattern comprising a repetitive set of elements having a first element size. Transferring a second pattern on the at least one exposure area on top of the first pattern, the second pattern comprising a repetitive set elements of a second element size, the second element size being larger or smaller than the first element size. The elements of the first and second patterns partly overlap and combined form a set of repetitive large-sized alignment marks, such that the edges of the alignment marks in the direction of repetition are formed by small-sized elements.

According to a still further embodiment of the present invention, there is provided a lithographic apparatus arranged to provide a pattern of alignment marks from a patterning device onto a substrate. The apparatus is arranged and constructed so as to (a) expose a first pattern on at least one exposure area of a layer of the substrate, the first pattern comprising a repetitive set of elements having a first element size and (b) expose a second pattern on the at least one exposure area on top of the first pattern, the second pattern comprising a repetitive set elements of a second element size, the second element size being larger or smaller than the first element size. The elements of the first and second patterns partly overlap and combined form a set of repetitive large-sized alignment marks, such that the edges of the alignment marks in the direction of repetition are formed by small-sized elements.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
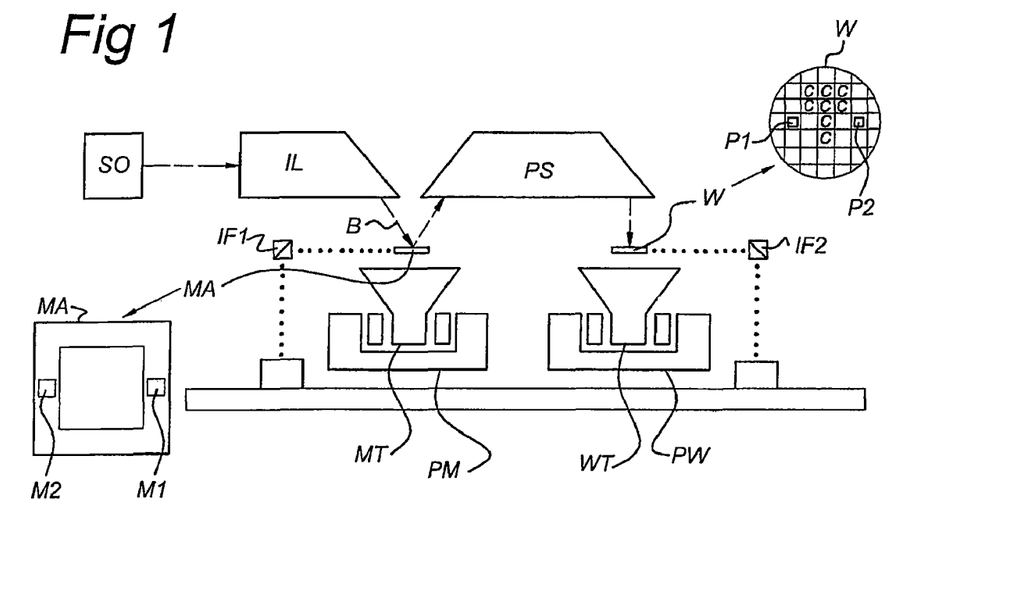
FIG. 1 depicts a lithographic apparatus, according to an embodiment of the invention.

FIG. 1 schematically depicts a lithographic apparatus according to one embodiment of the invention. The apparatus comprises an illumination system (illuminator) IL configured to condition a radiation beam B (e.g., UV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g., employing a reflective mask). Alternatively, the apparatus may be of a transmissive type (e.g., employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In general, a wafer or substrate is covered with a large number of layers. Each layer starts with the exposure of pattern on the substrate. The pattern has to fit exactly on the previous one. In practice, there will always be an offset between consecutive layers. This offset may for instance be caused by a slight misalignment of the substrate in case the substrate is repositioned, after it has been out for chemical processing, inside the exposure unit so that all patterns of the individual layers fit accurately on top of each other. The offset or displacement of the layers relative to one another is referred to herein as the overlay error or overlay.

Figure 2:
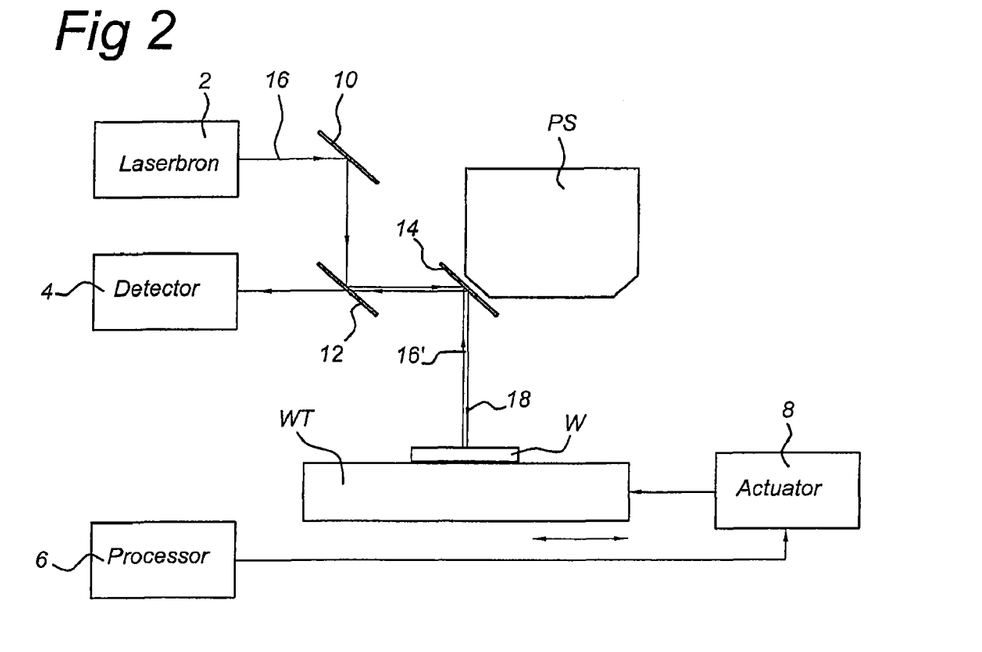
FIG. 2 depicts a schematic diagram of a laser step alignment apparatus, according to an embodiment of the invention.

FIG. 2 depicts a schematic diagram of a laser step alignment apparatus, according to an embodiment of the invention.

The overlay is determined by one or more alignment sensors arranged to measure the positions of substrate alignment marks. FIG. 2 shows an example of a laser step alignment arrangement. The arrangement shown comprises a laser source 2, a mirror 10, a semi transparent mirror 12, a mirror 14, a detector 4, and a processor 6. Also shown in FIG. 2 are the projection system PS, the substrate W and the substrate table WT, as well as an actuator 8.

In use, the laser source 2 generates a laser beam 16 that is directed to the mirror 10. The mirror 10 reflects the laser beam 16 to the semi-transparent mirror 12. The laser beam 16 as reflected by the semi-transparent mirror 12 is directed to the mirror 14. The laser beam 16 reflected by the mirror 14 is directed as an alignment beam 18 to a substrate alignment mark P1 on substrate W. The alignment beam 18, as received by the mark P1, is diffracted by the mark P1 as diffracted radiation 16' back to the mirror 14. The mirror 14 reflects the diffracted radiation 16' to semi-transparent mirror 12. The mirror 12 is semi transparent and passes a portion of the diffracted radiation 16' to the detector 4. The detector 4 receives the portion of the diffracted radiation 16' and generates an output signal for processor 6.

The actuator 8 shown in FIG. 2 is intended to illustrate that the substrate table WT may be moved to such a position that the mark P1 can be aligned with the alignment beam 18. Moreover, the actuator 8 is arranged to move the substrate table WT to allow exposing of the substrate W by exposure light through the projection system PS, as is known to persons skilled in the art. The actuator 8 is controlled by processor 6. Of course, in practice, there may be more than one actuator to allow movement of the substrate table WT in a plurality of directions. It is noted that the processor 6 is shown as one single processor unit connected to both the detector 4 and the actuator 8. However, if desired, multiple, different functions of the processor 6 may be implemented in different processors. These processors need not necessarily be within the lithographic apparatus but may be located outside the lithographic apparatus.

The signal received by the processor 6 may be used by the processor 6 to align the layer on which the mark P1 is located. To that end various algorithms can be used as is known to persons skilled in the art.

The invention is also applicable with other types of alignment setups, e.g., in a setup with a so-called "Athena" sensor. This alignment sensor measures a position of an alignment mark. During alignment, the alignment mark is illuminated with an alignment beam of radiation. The alignment beam of radiation is diffracted by the alignment mark into several diffraction orders such as +1, −1, +2 and −2. Using optical elements, each set of corresponding diffraction orders (e.g., +1 and −1) may be used to form an image of the alignment mark onto a reference plate. The reference plate may comprise reference gratings for each set of corresponding diffraction orders to be measured. Behind each reference grating a separate detector may be arranged to measure the intensity of the radiation in the image passing through the reference gratings. By moving the alignment mark relative to the reference plate, the position with the highest intensity for one or more images may be found, which gives the aligned position.

To enhance performance, the intensity of several images may be measured and the alignment beam of radiation may consist of multiple colors. Use of still other types of sensors is not excluded, including sensors based on capacitive or acoustic measurement principles.

Figure 3A:
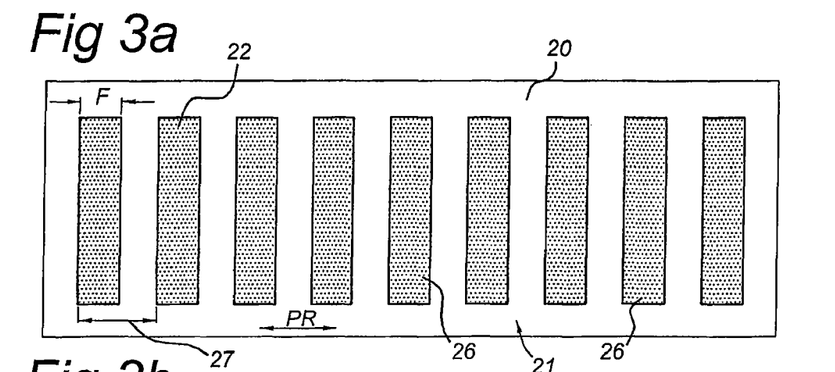
FIG. 3A depicts a schematic representation of an embodiment of a first alignment pattern.
Figure 3B:
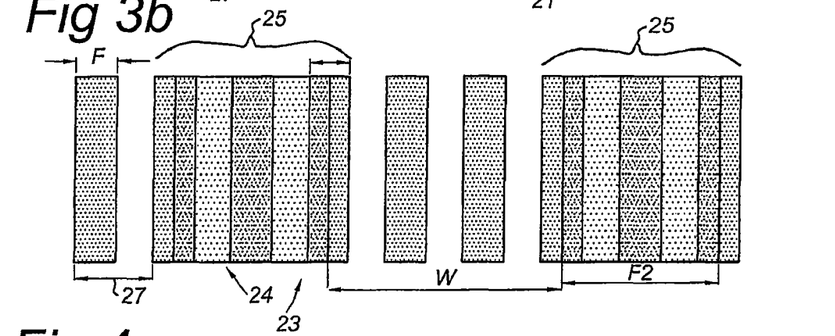
FIG. 3B depicts a schematic representation of an embodiment of second alignment pattern, combined with the alignment pattern of FIG. 3A, to form an alignment mark.

FIGS. 3A and 3B show an example of sets of alignment patterns forming alignment marks in accordance with an embodiment of the present method. The method comprises exposing at an exposure area of a first layer 20 a first dense pattern 21 of repetitively arranged pattern elements. In the embodiment shown, the pattern 21 is composed of an array of essentially parallel elements 22 (hereafter referred to as "trenches" although it is to be understood that in other embodiments similar elements or lines may be applied as well). The trenches are spaced apart with a constant pitch 27 and each trench 22 has a first width (F1). The first width may be of the order of magnitude of typical product features. The dimensions to be achieved nowadays in lithography are in the range of 45 nm or less and may in the future even reach smaller values, such as 32 nm or less. However, in other embodiments the first width may be also be much larger than the pitch at resolution. For instance, by enlarging the pitch starting from the pitch at resolution, the print error as function of the pitch may be determined, as will be discussed hereafter.

After having exposed the first pattern 21, i.e., the trenches 22 at resolution, the photo resist layer 20 is developed. During exposure the first layer pattern 21 may have been shifted, for instance due to a lens distortion, a reticle writing error, or any other tool induced offset (e.g., an immersion related shift or lens heating). After exposing layer 20 a second alignment pattern 23 is exposed on the exposure area on top of the first pattern 21. As shown in FIG. 3B, also the second pattern 23 comprises a set of repetitive elements composed of an array of essentially parallel second trenches 24, the second trenches 24 having a width (F2) larger than the width (F1) of the first elements 22. The trenches 24 of the second alignment pattern 23 partly overlap the trenches 22 of the first alignment pattern 21 so as to form a plurality of combined alignment marks 25, as is shown in FIG. 3B. The second trenches are sized and arranged so as to overlap the first trenches in such a way, that the edges of the combined alignment marks 25 are formed by the edges 26 (in the direction of repetition Pr, e.g., FIG. 3A) of the first elements 22. In this way large-sized alignment marks 25 may be produced, that as result of their size can be detected by a standard alignment sensor, whereas the accuracy of the alignment marks 25, and thereby the aligned position, is determined by the small-sized elements 22 of the first pattern 21. Or, in other words, by the double exposure of patterns (images) on the exposure area, one or more double exposure alignment marks 25 may be created, wherein the accuracy of the alignment marks may be improved considerably and the position of an alignment mark can be determined at a much higher resolution than the low resolution of the standard alignment marks would permit.

In further embodiments the small-sized elements may be sized at resolution, i.e., at the smallest level of detail that can be seen or imaged by the lithographic tool, nowadays typically about 45 ml, as mentioned earlier. Examples of embodiments wherein the small-sized pattern elements are sized at resolution are given hereafter.

In the embodiment described above, both the first pattern and the second pattern are exposed in the same layer. Instead of this double exposure in the same layer (i.e., a double patterning (DPT) application), the first pattern may be exposed in a first layer and the second pattern may be exposed in a second layer, overlaying the first layer. In this way the contrast of an alignment mark may be enhanced. By combining the second pattern in the second layer with the first pattern in the first layer, the resulting mark may have a higher contrast than a standard mark defined in the first layer. Due to design requirements, it may even not be possible to define a mark in a first layer having enough contrast. Especially when a Hard Mask is used for a third layer exposure and alignment to the first layer is needed, the alignment mark according the present invention may be applied, as will be discussed hereafter.

One may even determine the position of a previous layer without actually having an alignment pattern in that layer, for instance in the DPT process.

Furthermore, in cases of exposing the first and second patterns in different layers, the resulting alignment marks can be aligned using the alignment system already present in the lithographic apparatus. The contrast is made by the second layer exposure and the aligned position is determined by the first layer exposure. It is to be understood that a second layer overlay error has no effect on the aligned position provided that the error remains smaller than ±F/2, wherein F is the smallest pattern element size printed in the first layer.

As will be discussed hereafter, the whole sequence of applying first and second patterns on one or more layers can reversed, i.e., the large-sized pattern element are exposed in the first layer and the dense pattern of small-sized elements (for instance trenches) is exposed in the second layer, placed on top of the first layer. In that case the aligned position is determined by the second layer pattern.

In embodiments of the invention the alignment mark is composed of a single large-sized pattern element partly overlapping at least two small-sized pattern elements.

More specifically, the large-sized element has a width that is larger than the mutual distance between consecutive small-size elements so that the large-sized element will overlap at least to some extent at least two of the small-sized elements. In other embodiments, however, more than one large-sized pattern element and a large number of small-sized pattern elements is employed. In order to ensure that in the latter embodiments the first and second patterns are matched to one another, the width (W, e.g., FIG. 3B) of the space between consecutive large-sized pattern elements is chosen to be an integer number times the pitch 27 of the small-sized pattern elements 22.

Figure 4A:
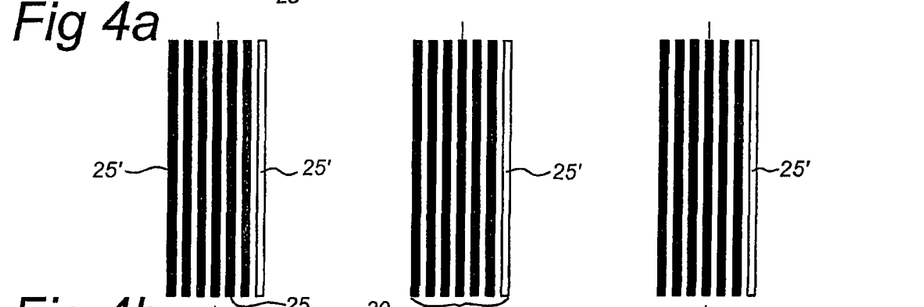
FIG. 4A depicts an alignment mark resulting from a known exposure method, according to an embodiment of the invention.
Figure 4B:
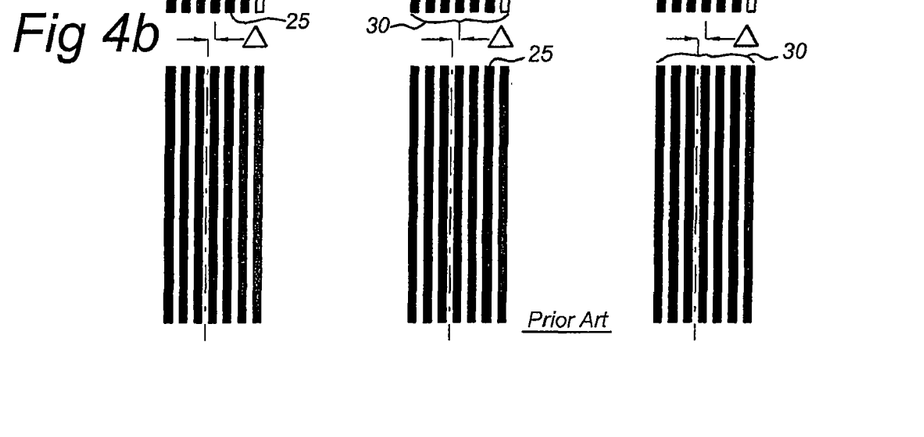
FIG. 4B depicts an embodiment of an alignment mark resulting from en exposure method according to an embodiment of the present invention.

FIG. 4A depicts an alignment mark resulting from a known exposure method, according to an embodiment of the invention. FIG. 4B depicts an embodiment of an alignment mark resulting from en exposure method according to an embodiment of the present invention. FIG. 4A shows three sets 30 of alignment marks 25 that are the result of a single exposure. Due to last trench (line) imaging effects the quality of the outer two trenches (or lines) 25' may be poor. The quality of trenches 25' is of crucial importance for determining the aligned position and therefore for ensuring a high alignment accuracy. Since these two trenches are semi-dense, this is not an easy task to perform. FIG. 4B shows three sets 30 of alignment marks 25 that are the result of a double exposure in accordance with an embodiment of the present invention. The outer trenches (or lines) 25' now result from a dense pattern 21 and the edges of the patterns formed by the last trenches 25' are well-defined so that high-quality alignments marks are formed on the substrate.

In the embodiments described in connection with FIGS. 3A and 3B, the first exposure creates a first pattern of relatively small-sized pattern elements 22, while the second exposure creates a second pattern of relatively large-sized pattern elements 23. In other embodiments, however, the situation is reverse. In a first exposure a first pattern of relatively large-sized pattern elements 23 is created, while the second exposure creates a second pattern of relatively small-sized pattern elements 22.

In further embodiments of the present invention a method is provided for determining the relative displacement of at least two layers provided with respective sets of alignment marks. The method comprises producing a first set of combined alignment marks on a first layer and a complimentary, second set of combined alignment marks on a second layer, provided on top of the first layer. Thereafter the two sets of combined alignment marks are irradiated and the relative displacement between the first and second sets of alignment marks is determined with high accuracy. An example of such embodiment is shown in FIGS. 5A-5F.

Figure 5A:
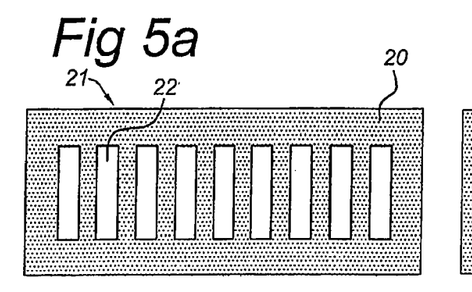
FIGS. 5A-5F depict various alignment patterns according to an embodiment of the present invention for determining overlay.
Figure 5B:
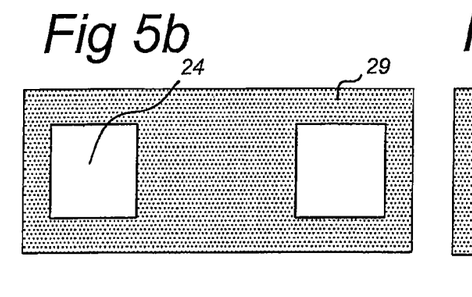
Figure 5C:
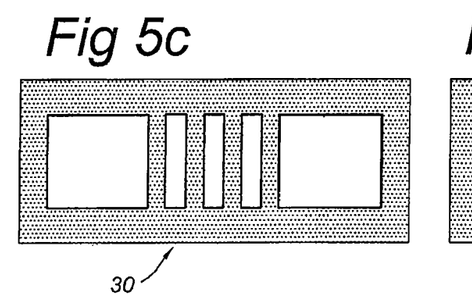
Figure 5D:
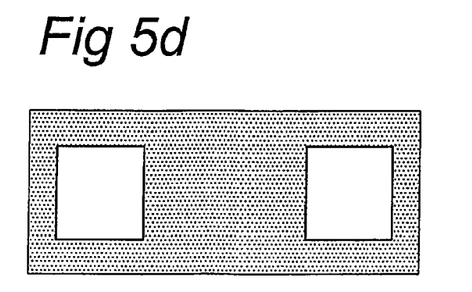
Figure 5E:
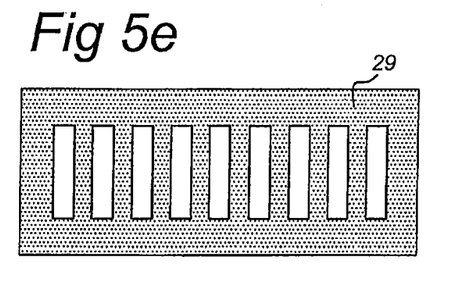
Figure 5F:
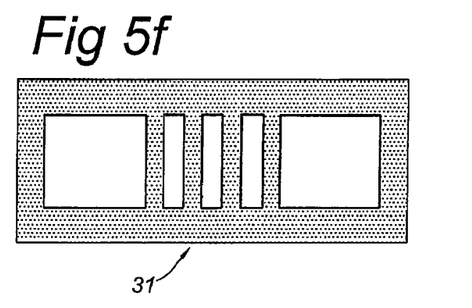

FIGS. 5A-5F depict various alignment patterns according to an embodiment of the present invention for determining overlay. FIG. 5A shows a first pattern 21 created at a first exposure area in a first layer 20 of a substrate. The first pattern is of the type comprising a plurality of consecutive small-sized elements 22, which may be in the form of a dense pattern at resolution. At another exposure area of the same first layer 20 a second pattern of the type comprising a plurality of consecutive large-sized elements 24 is exposed, as is shown in FIG. 5D. Next a second layer 29 is placed on top of the first layer 20. At the same exposure area of FIG. 5A a third pattern is exposed on the second layer 29, wherein the third pattern is of the type having a plurality of large-sized elements 24 partly overlapping the first pattern (e.g., FIG. 5B). Similarly, on top of the large-sized elements 24 at the same exposure area of FIG. 5D a plurality of small-sized elements 22 is exposed, as is shown in FIG. 5E. FIGS. 5C and 5F now show the resulting alignment marks 30,31 at both exposure areas. The alignment mark 30 is representative of the X,Y position (at resolution) of the first layer 20, while alignment mark 31 is representative of the X,Y position (at resolution) of the second layer 29. The difference between both positions renders the overlay offset or overlay at resolution. Consequently, for determining the overlay at resolution use may be made of overlay sensors present in the lithographic apparatus, for instance alignment sensors of the SMASH type (e.g., EP 1372 040 A2) or Athena type (e.g., EP 0 906 590 A1) or any other diffraction/phase grating type of detection system, both of which are incorporated by reference herein in their entireties. Moreover, camera or image based systems may be used as well to detect the position of the structures at resolution. In this way it is possible to measure overlay at resolution (of the features of the substrate) by way of an alignment sensor capable only of measurement at a lower resolution.

Figure 6A:
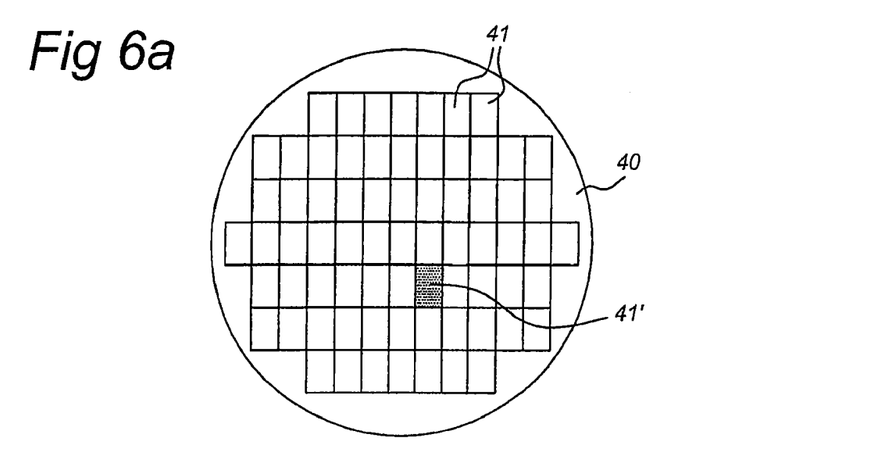
FIG. 6A depicts a top view of a wafer containing a die with distorted features, according to an embodiment of the invention.
Figures 6B, 6C:
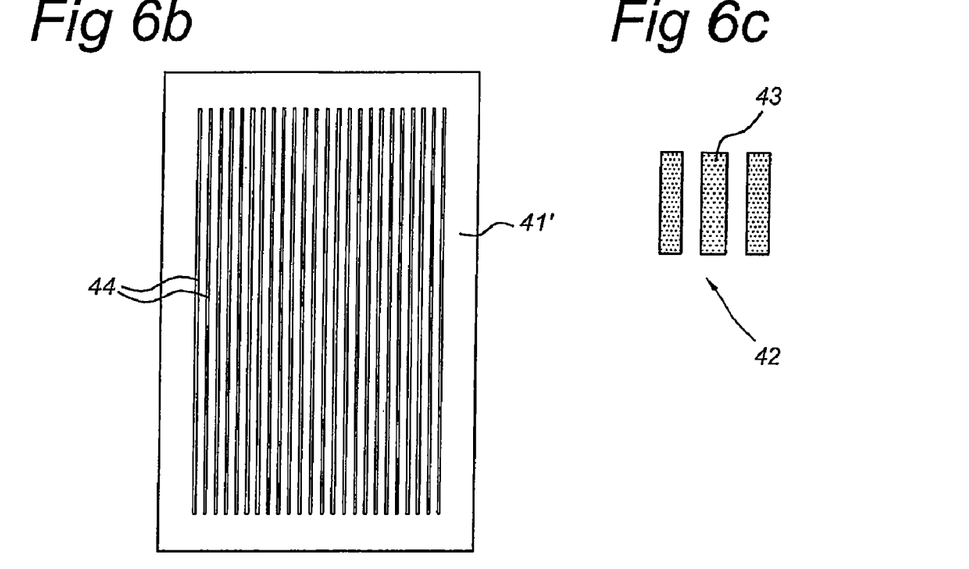
FIG. 6B depicts a top view in more detail of the die of FIG. 6A, according to an embodiment of the invention.
FIG. 6C depicts a top view of an example of a sample mark to be applied on the die of FIG. 6B, according to an embodiment of the invention.
Figure 6D:
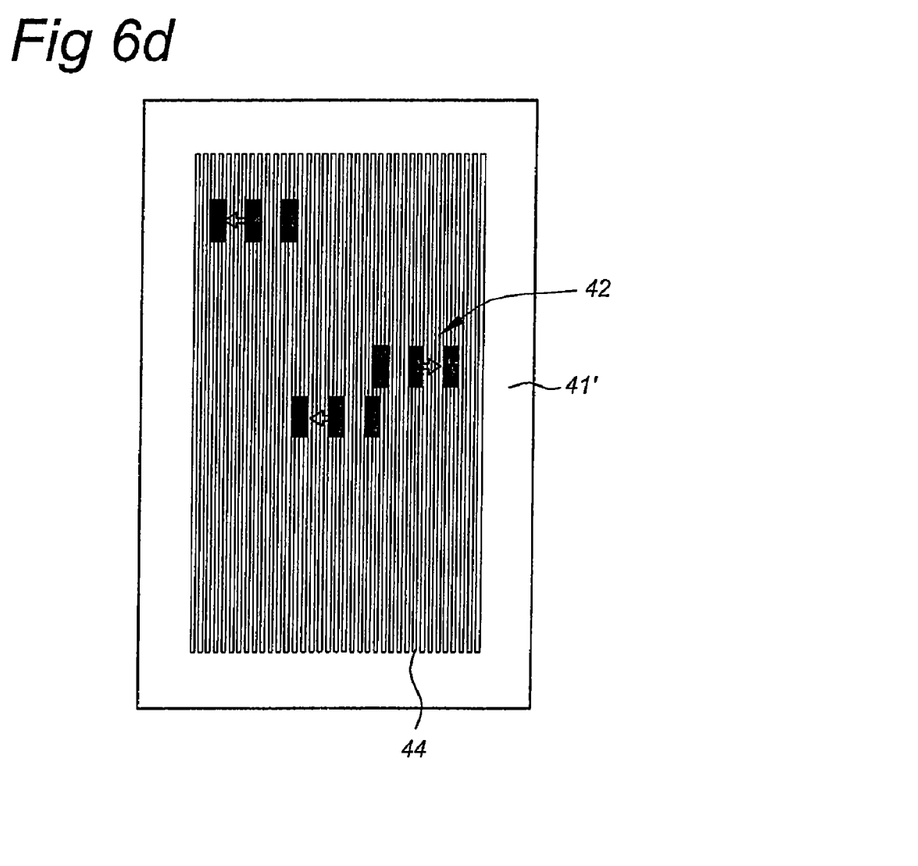
FIG. 6D depicts a top view of the die of FIG. 6B, provided with a plurality of sample marks for measuring the product distortion, according to an embodiment of the invention.

FIG. 6A depicts a top view of a wafer containing a die with distorted features, according to an embodiment of the invention. FIG. 6B depicts a top view in more detail of the die of FIG. 6A, according to an embodiment of the invention. FIG. 6C depicts a top view of an example of a sample mark to be applied on the die of FIG. 6B, according to an embodiment of the invention. FIG. 6D depicts a top view of the die of FIG. 6B, provided with a plurality of sample marks for measuring the product distortion, according to an embodiment of the invention. In the embodiment shown in FIGS. 6A-6D the small-sized elements of a pattern are formed by product features at an overlay target area. FIG. 6A shows a wafer 40 having a large numbers of dies to be exposed. FIG. 6B shows a blown up detail of one of the dies 41' of the wafer 40. It shows the product features 44 of a die 41', for instance a large number of parallel word lines in a DRAM memory, trenches, bit lines or control gates. Distortions of the parallel elements, for instance due to lens and reticle distortions, errors which are immersion related, errors in the mask, substrate table or errors caused by lens heating, are present. On top of the photo resist features of FIG. 6B a second layer is exposed wherein a number of alignment patterns 42 is provided, each having a set of repetitive alignment pattern elements 43. The resulting product is shown in FIG. 6D. Each alignment pattern 42 forms together with the existing product features 44, an alignment mark that can be used to determine to local distortion of the die. In fact the distortion may be determined as function of the location on the die. While in FIG. 6D three alignment marks 42 are depicted, the number of alignment marks may vary, depending on the product characteristics.

The method may also be used to calibrate for lens heating effects. During exposure of subsequent fields on the substrate the lens or lenses of the projection system is heated up. The heating process influences the characteristics of the lens, i.e., when the lens is heated in the exposure process, the lens distortion is changed. Therefore the lens distortion when the first field is exposed generally differs from the lens distortion when a further field is exposed. Consequently, the pattern exposed on the substrate may be used to determine information about the effects of heating on the lens distortion. Based on this information a calibration of the projection system can be performed, for instance by manipulating the projection system to account for the expected changes in lens distortion during exposure of a substrate.

Although in the above embodiments a constant pitch is used, in other embodiments a varying pitch of the small-sized elements may be employed as well, for instance varying from almost isolated (ISO) lines, i.e., lines having a relatively large pitch, but smaller than the pitch of the large sized elements (alignment mark), to the dense lines shown in FIG. 6. These small-sized elements are exposed by the exposure light, the exposure light typically having a relatively short wavelength, e.g., "blue" light with a wavelength ($\lambda$) of about 193-nm. The structures for forming the small-sized elements on the substrate are present on the mask (or reticle) and diffraction of the "blue" light occurs. The diffracted light then passes the exposure lens. Light diffracted from an ISO structure and light from a dense structure pass the lens in different ways.

Therefore, patterns with different pitches (i.e., small-sized pitches in comparison with the larger pitch or alignment pitch of the large-sized elements forming the alignment mark) are diffracted differently by the exposure light and experience a different lens distortion (optical path is different though the exposure lens). The different lens distortion causes a different displacement (offset) of the features on the substrate. By exposing a second pattern with a large-sized pitch on the first pattern (having small-sized elements), the displacement (offset) may be determined.

Alignment is generally performed by one or more alignment sensors, wherein an alignment sensor has a light source generating light with a relatively large wavelength, e.g., "red" light with a wavelength of 633 nm. This light causes diffraction of the elements with a large-sized pitch, i.e., the pitch of the large-sized elements. The alignment sensors are configured to detect the light diffracted from these large-sized elements with a large-sized pitch and therefore are able to perform an alignment process. However, in accordance with an embodiment, the position of the alignment marks is determined by the pattern of small-sized elements and therefore by the different small-sized elements. Since each individual small-sized pitch ends up differently at the substrate (aberration induced displacement), a set of patterns having different pitches may be used to determine information about the effects of the pitches of the features (e.g., isolated (ISO) lines and dense lines) on the alignment signal sensed by the alignment sensors. Based on this information an ISO-dense calibration may be performed.

Figure 7A:
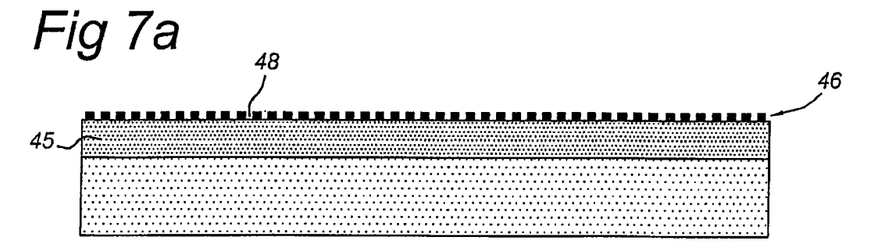
FIGS. 7A-7C depict respective schematic views in cross-section of further embodiments in a DPT application.
Figure 7B:
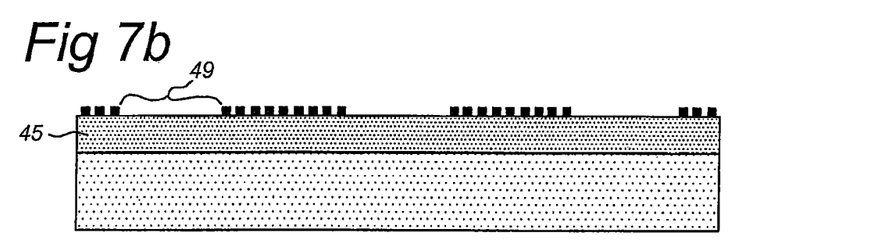

FIGS. 7A-7B relate to a further embodiment of the present invention. In this embodiment alignment marks are defined in a double patterning (DPT) application. The figures show a substrate 45 on top op which a hard mask 46 has been applied. In a first patterning step a first pattern with relatively small-sized pattern elements or trenches 48 is patterned in the layer 46. The result after the first patterning process is depicted in FIG. 7A. Then a second patterning step is performed and a second pattern with relatively large-sized elements 49 is patterned in layer 46. Referring to FIG. 7B, the combination of the small-sized elements 48 and the large sized elements 49 renders an alignment mark. More specifically, the alignment mark itself is defined in the second patterning process, while the aligned position is defined in the first patterning process.

Figure 7C:
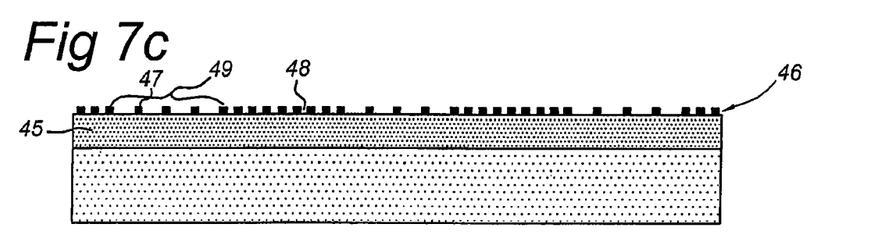

FIG. 7C shows an alternative embodiment wherein after the second patterning process some protrusions (lines) 47 remain present in the area occupied by the large-sized pattern elements 49 of FIG. 7B. Or, in other words, during patterning of the large-sized elements a subset of the small-sized elements at the areas of the large-sized elements is kept substantially intact. The number of protrusions should be kept small enough to create sufficient contrast for the a combined alignment mark to be created, while at the same time the number should be large enough to meet with the pattern density requirements, for instance demanded by the chips manufacturer.

Figure 8A:
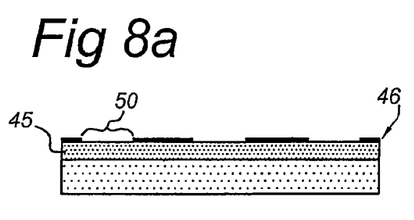
FIGS. 8A-8D depict schematic views in cross-section of further embodiments showing contrast versus pattern density requirements.
Figure 8B:
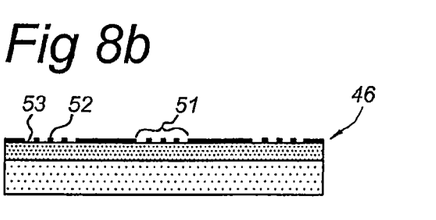
Figure 8C:
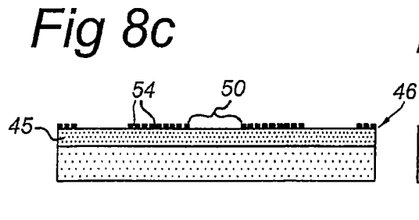
Figure 8D:
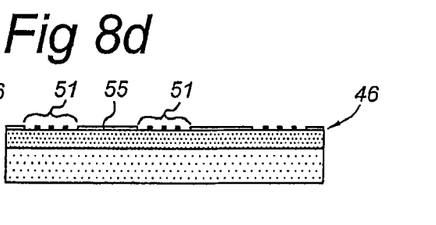
Figure 8E:
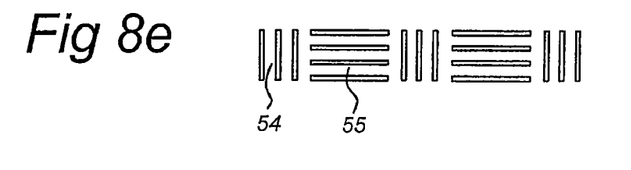
FIG. 8E depicts a top view of the embodiment shown in FIG. 8D, according to an embodiment of the invention.

FIGS. 8A-8E relate to a further embodiment of the present invention, wherein, similar to the embodiments described in connection with FIGS. 7A-7C, an alignment pattern is created in a hard mask layer in a double patterning (DPT) application, more specifically a double exposure application. The object of the present embodiment is to define in a first exposure a pattern (mark) having a good contrast and to add subsequently, in a second exposure, the respective process segmentation in order to fulfill pattern density requirements. The figures show a substrate 45 on top op which a hard mask 46 has been applied. In a first patterning step a first pattern with relatively large-sized pattern elements or trenches 50 is patterned in the layer 46. The result after the first patterning process is depicted in FIGS. 8A and 8B. In FIG. 8A a number of large-sized pattern elements 50 is provided, while in FIG. 8B a similar pattern with large-size pattern elements 51 is provided wherein a number of small-sized elements, for instance lines 52, is kept intact. However, the areas 53 in between the small-sized elements 52 are large enough to keep a pattern with essentially large-size pattern elements 51. In this way any pattern density requirements may be met.

In both situations a pattern having a relatively high contrast is achieved. Then the second patterning step is performed and a second pattern with relatively small-sized elements or trenches 54 is patterned in layer 46. Starting from the situation of FIG. 8A, trenches 54 are patterned in a direction parallel to the grating period, resulting in the layout shown in FIG. 8C. The combination of the small-sized elements 54 and the large sized elements 50 renders an alignment mark. The alignment mark shown in FIG. 8A has a high contrast that might be required in order to be able to perform the second exposure. However, the mark 8A might violate the customer design rules. This may be of particular use in DPT applications or when a mask is followed by a so-called trim mask.

Starting from the situation of FIG. 8B, wherein some parts of the original lines or small-sized elements 52 have been kept intact, the trenches cannot be patterned in the direction parallel to the grating period. Instead the trenches 55 are patterned in a direction perpendicular to the grating period (e.g., the gray areas), resulting in the alignment marks as shown in the cross-section of FIG. 8D and the top view of FIG. 8E. At this point, the alignment mark is in compliance with the design rules and the underlying substrate can be etched.

Figure 9A:
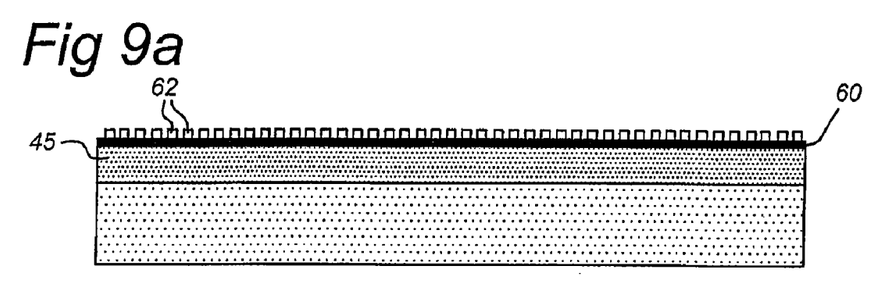
FIGS. 9A-9C depict schematic views in cross-section of further embodiments in spacer technology application.
Figure 9B:
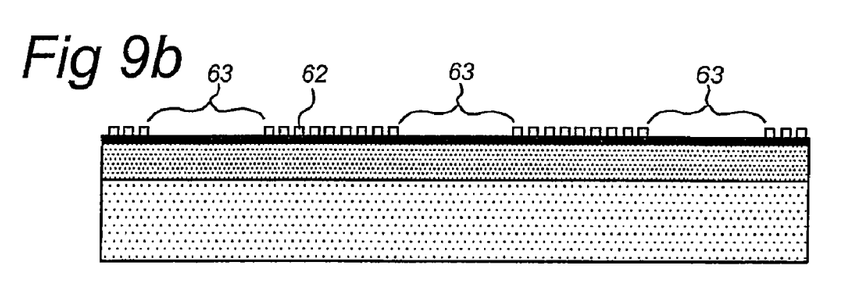
Figure 9C:
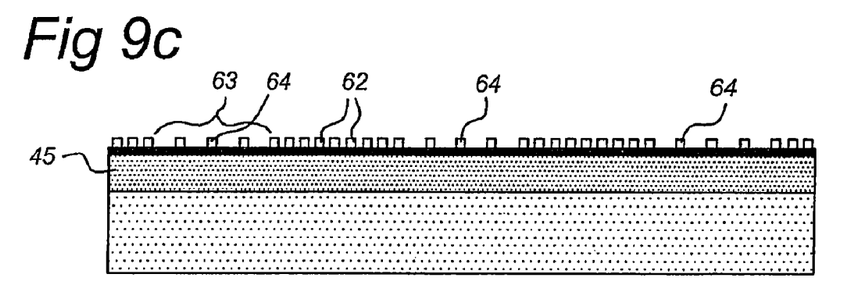

FIGS. 9A-9C illustrate a further embodiment of the present invention. FIG. 9A shows a substrate 45 on top of which a hard mask 60 is applied. In a manner known as such in the art, the hard mask 60 has been provided with a plurality of spacers 62. In other words, on the hard mask 60 features are patterned, a film is formed on the hard mask and its features, the film is partly etched away so that the horizontal surfaces of the features are exposed, leaving only the film material on the sidewalks thereof and the original patterned features are removed. The result is that only the film material is left, the film material forming the spacers 62, as shown in FIG. 9A. The spacers constitute a first pattern of small-sized patterns elements.

In a further step a trim mask is applied, removing (trimming) a part of the spacers and resulting in the pattern shown in FIG. 9B. The trim mask partly removes the spacers 62 and thus produces a repetitive set of relatively large sized pattern elements 63. The combination of the small-sized pattern elements (spacers 62) and the large-seized pattern elements 63 forms an alignment mark. Again, the alignment mark is defined in the trim mask while the aligned position is defined by the layer of spacers.

FIG. 9C illustrates another embodiment with an alternative layout. The trim mask removes a number of spacers 62, but keeps several spacers 64 in the area occupied by the large-sized element 63 in FIG. 9B intact in order to be able to comply with certain pattern density requirements.

Figure 10A:
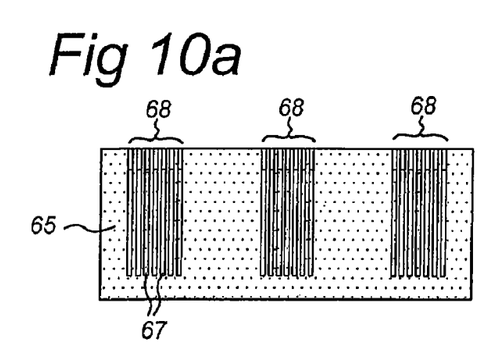
FIGS. 10A-10D depict schematic views in cross-section of further embodiments in a deep trench application.
Figure 10B:
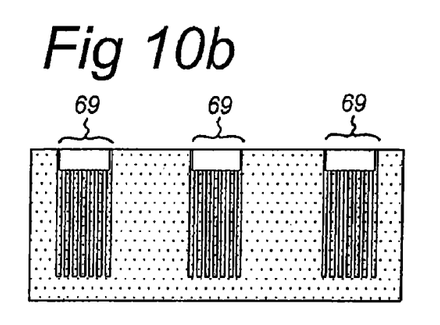

FIGS. 10A and 10B illustrate a further embodiment of the present invention. The figures show a substrate, typically a part of a memory chip having a large number of capacitors, in which substrate a deep trench layer 65 is present. Deep trench layer 65 contains a number of deep trenches 67 (depth typically 8 μm or more), typically arranged to form a repetitive set of relatively small-sized pattern elements. Furthermore, the deep trenches 67 (i.e., the small sized pattern elements) are arranged into groups of deep trenches 67 to form a set of repetitive large-sized pattern elements. The groups of deep trenches 67 together form an alignment mark. In FIG. 10A the alignment mark is comprised of three groups of deep trenches 67. This number may vary and in most applications will be larger than three. Now in order to enhance the contrast of the alignment mark, a part of the upper portion of the deep trench layer 65, at the location of the deep trenches, may be removed, for instance by an Active Area exposure process. The resulting pattern is illustrated in FIG. 10B. The removal is performed in such a way that a number of large-sized pattern elements 69 is created in such a way that the large-sized pattern elements 69 partly overlap a plurality of small-sized pattern elements 67, while the edges of the large-sized elements 69 are formed by original deep trenches 67. The presence of the large-sized pattern elements improves the contrast of the alignment mark, but the positioning of the alignment mark is still determined by the deep trenches 67.

Figures 10C, 10D:
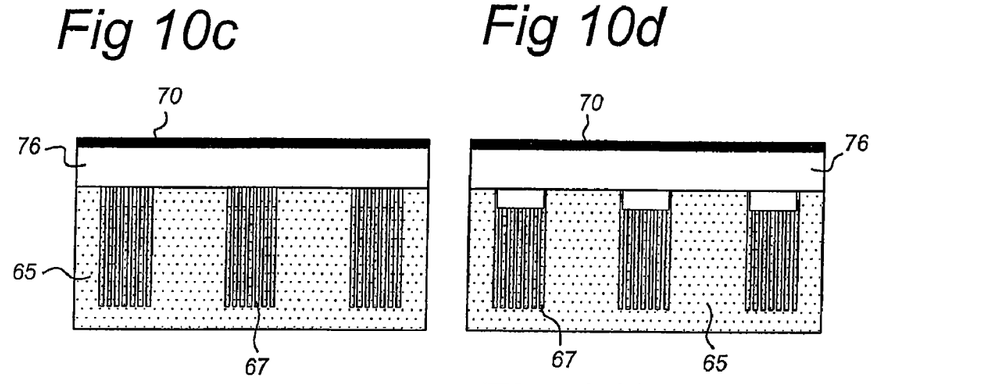

Contrast enhancement may be especially beneficial in situations wherein an alignment mark is defined in a deep trench layer underneath a hard mask in one of the subsequent layers. This situation is schematically shown in FIG. 10C. FIG. 10C illustrates the layout of FIG. 10A, wherein on top of the deep trench layer 65 a further layer 76 and a hard mask 70 have been applied. Due to the presence of the further layer 76 and especially the hard mask 70 the contrast of the alignment mark (e.g., FIG. 10C) might be too low. When the contrast enhancing process of removing a part of the upper portion of the deep trench layer 65, more specifically the Active Area exposure process (or any other processing step that can be used to enhance the contrast), is applied (e.g., FIG. 10B) and the subsequent layer 76 and hard mask 70 are provided on top of the processed deep trench layer 65, this results in an alignment mark with a better contrast (e.g., FIG. 10D). The contrast may even be enhanced to such extent, that the aligned position can be determined by the deep trenches of the first layer (i.e., the deep trench layer 65) even though a hard mask (forming a third layer) is present.

Figures 11A, 11B:
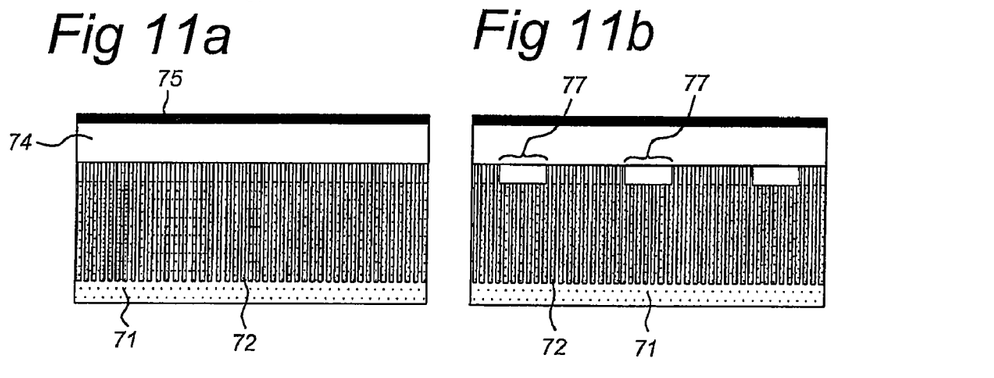
FIGS. 11A-11B depict schematic views in cross-section of further embodiments, in another deep trench application.

FIGS. 11A and 11B illustrate a further embodiment of the present invention, in a configuration similar to the configuration described in connection with FIGS. 10A-10D. In the present embodiment a substrate comprises a deep trench layer 71 in which a plurality of deep trenches 72 has been provided. The deep trenches 72 are not grouped, but are more or less evenly distributed along the deep trench layer 71. On top of the deep trench layer 71 a further layer 74 and a hard mask 75 is applied. This configuration, wherein no alignment mark is defined, is shown in FIG. 11A. In order to provide the substrate with an alignment mark, at several locations the upper portion of the deep trenches 72 is removed so that a number of large-sized elements or recesses 77 are present in the upper portion of the deep trench layer 71. The recesses can be made by any process, for instance an Active Area exposure process. When the recesses have been made, the further layer 74 and subsequently the hard mask 75 is applied on top of the deep trench layer 71. The recesses 77 together with the deep trenches 72 form a alignment mark. The contrast of this alignment mark is determined by the recesses 77, while the aligned position is determined by the trenches 72 in the deep trench layer 71.

Figure 12A:
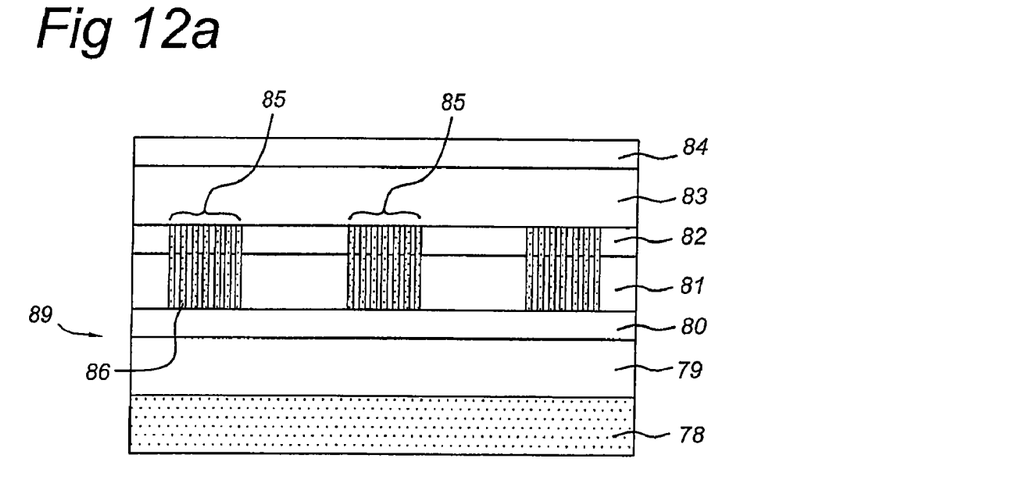
FIGS. 12A-12C depict schematic views in cross-section of further embodiments, in a via layer application.
Figure 12B:
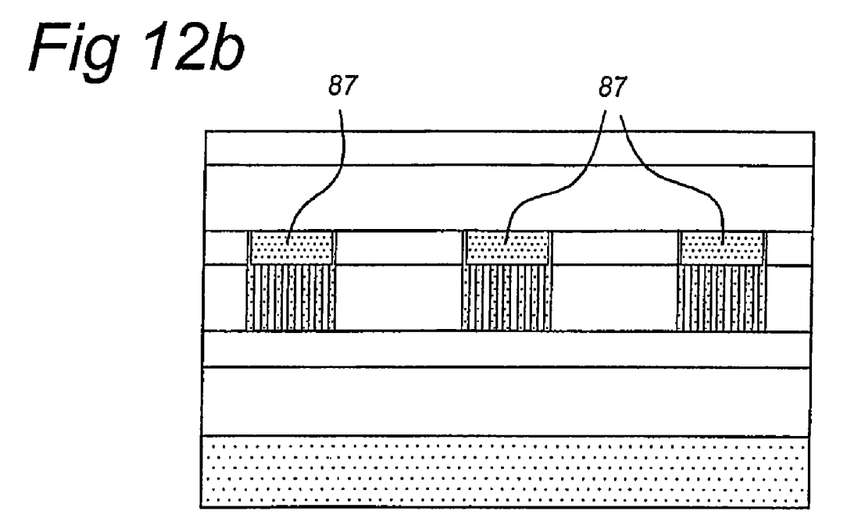
Figure 12C:
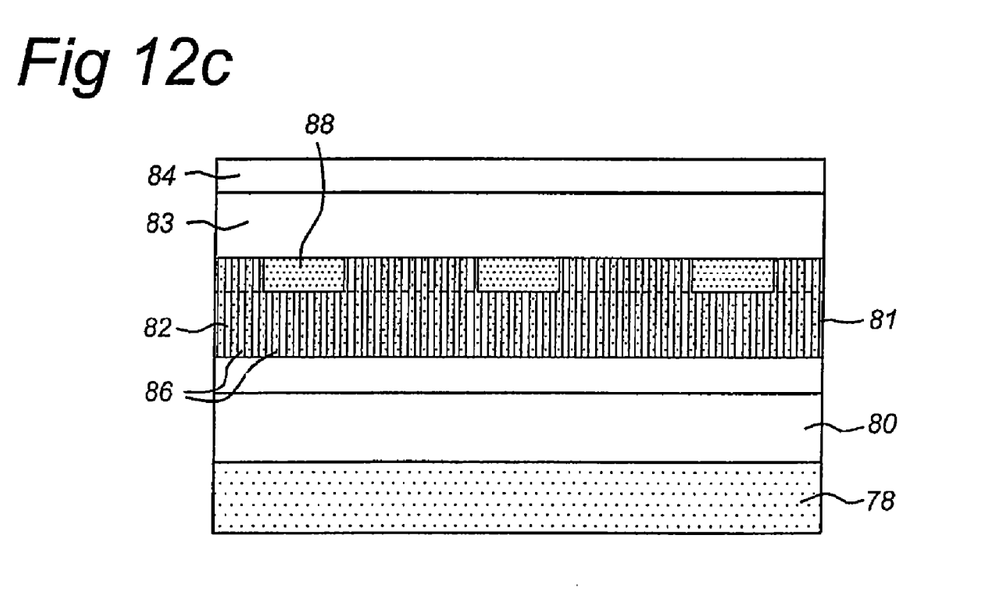

FIGS. 12A-12C illustrate a further embodiment of the invention, wherein the concept of combining different alignment patterns to form an alignment mark is applied to via layers. FIG. 12A shows a substrate 89 composed of a plurality of layers 78-84 placed on top of each other. Layers 81 and 82 haven been provided with groups 85 of metal contacts or vias 86 for interconnecting metal layers 80 and 82. The vias 86 form a repetitive set of small-sized pattern elements in the sense of the present invention. The vias are also arranged in groups 85, each group forming an element of a set relatively large-sized elements. In situation wherein these small-sized pattern elements are not processed further, they may be considered to form an alignment mark. In FIG. 12A three groups of vias 86 are depicted, although in practice the number of groups forming together an alignment mark may be different. However, the contrast of this type of alignment mark may prove to be insufficient. In order to improve the contrast of the alignment mark (while keeping the accuracy of the original alignment mark defined by the vias 86), the upper portion of the vias may undergo a metal exposure process to render the configuration shown in FIG. 12B.

The metal exposure process causes the upper portion of the vias to define a repetitive set of large-sized elements 87, each element 87 being sized and arranged to partly overlap the group 85 of vias 86. The combination of the small sized pattern elements (i.e., the vias 86) and the large size elements (i.e., the metal exposed portions) form an alignment mark. The contrast of this alignment mark is improved since it is determined by the large-sized metal exposed portions 87, while the accuracy (aligned position) is determined by the small-sized vias 86 (since the edges of the alignment mark are formed by vias 86, as can be seen in FIG. 12B).

In FIG. 12C another embodiment of the present invention is illustrated. In this embodiment the vias 86 are sized and arranged to for a set of repetitive small-sized pattern elements, similar to the embodiment discussed in connection with FIG. 12A, but the small-sized pattern elements are not grouped into a set forming relatively large-sized elements 85. In the present embodiment an alignment mark is only formed after a metal exposure process to provide the configuration as shown in FIG. 12C. The metal exposed portions 88 define a set of large-sized elements, which, in combination with the small-sized elements formed by the vias 86, form an alignment mark. The metal exposed portions 88 are sized and arranged so that the edges of the alignment mark are formed by vias 86 and not by the metal exposed portions, as is shown in FIG. 12C. Consequently, the alignment mark provides a good contrast since it is determined by the large-sized metal exposed portions 88, while the accuracy (aligned position) is high since this is determined by the small-sized vias 86. In this embodiment the vias are exposed as trenches, while in other embodiments the vias are exposed as contact holes.

In a further embodiment (not shown in the figures) the method comprises providing the first and second patterns in one or more scribe lanes between exposure fields of the substrate. For instance, by providing the first pattern of relatively small sized pattern elements in the left one of the scribe lanes of a first field of a substrate, providing the second pattern of relatively large sized pattern elements in the right scribe lane of the first field and repeating the steps of providing the first and second patterns in the scribe lanes of a second field of the substrate, the second field abutting the first field so that the pattern provided in one of the scribe lanes of the first field overlaps the pattern provided in one of the scribe lanes of the second field, for instance by overlappingly exposing the first and second field (stitching), an alignment mark in the scribe line may be achieved. A similar process in possible in case of an alignment mark provided in the upper and lower scribe lane of the field.

As will be appreciated, in several of the embodiments illustrated in the Figures, the marks are substantially rectangular. As will be further appreciated, the marks need not be perfectly rectangular, but may include minor irregularities in shape including, for example, corners that are not perfectly square, and sides that are not perfectly straight and even. Instead, they merely ought to be sufficiently rectangular to act as gratings for alignment purposes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:
    exposing a first pattern on at least one exposure area of a layer of a substrate, the first pattern comprising a set of repetitive elements having a first element size; and
    exposing a second pattern over the first pattern, the second pattern comprising a set of repetitive elements of a second element size, the second element size being different, and either small-size pattern elements or large-size pattern elements, from the first element size, that are the other of either small-size pattern elements or large size pattern elements,
    wherein the elements of the first and second patterns at least partly overlap and form an alignment mark comprising a set of repetitive large-sized pattern elements, such that edges of the large-sized pattern elements in the direction of repetition are formed by the small-sized pattern elements when properly aligned.

2. The method of claim 1, wherein a width (W) of a space between consecutive ones of the large-sized pattern elements is an integer number times a pitch of the small-sized pattern elements.

3. The method of claim 1, wherein the first pattern comprises the small-sized pattern elements and the second pattern comprises the large-sized pattern elements.

4. The method of claim 1, wherein the first pattern comprises the large-sized pattern elements and the second pattern comprises the small-sized pattern elements.

5. The method of claim 1, wherein the first pattern is exposed in a first layer and the second pattern is exposed in a second layer, at least partially overlaying the first layer.

6. The method of claim 1, wherein both the first pattern and the second pattern are exposed in a same layer.

7. The method of claim 1, wherein the alignment marks are for use in imaging a pattern having a resolution and the small-sized pattern elements are sized at the resolution of the pattern.

8. The method of claim 7, further comprising aligning the alignment mark at a resolution of the small-sized pattern elements.

9. The method of claim 1, further comprising determining a position of the alignment mark at a resolution of the small-sized pattern elements.

10. The method of claim 1, further comprising determining a contrast between the alignment mark and its surroundings at a resolution of the large-sized pattern elements.

11. The method of claim 1, further comprising:
    forming a first set of alignment marks wherein the first pattern in a first layer comprises the small-sized pattern elements and the second pattern in a second layer comprises the large-sized pattern elements;
    forming a second set of alignment marks wherein the first pattern in a first layer comprises the large-sized pattern elements and the second pattern in the second layer comprises the small-sized pattern elements;
    determining a position of the first layer from the first set of alignment marks;
    determining a position of the second layer from the second set of alignment marks; and
    determining an overlay offset from the determined position of the first layer and the determined position of the second layer.

12. The method of claim 1, wherein the small-sized pattern elements form a dense pattern formed by lines or trenches.

13. The method of claim 1, wherein each element is substantially rectangular, and the large-sized pattern elements have a width that is larger than a mutual distance between consecutive small-size pattern elements.

14. The method of claim 1, wherein the small-sized elements of a pattern are formed by product features at an overlay target area.

15. The method of claim 1, wherein during patterning of the large-sized pattern elements a subset of the small-sized pattern elements at the areas of the large-sized elements are kept substantially intact.

16. The method of claim 1, further comprising a plurality of large-sized pattern elements having varying pitch between the small-sized pattern elements.

17. A method comprising:
    when a projection system is in an initial condition, performing a first exposing of a first pattern on at least one exposure area of a layer of a substrate, the first pattern comprising a repetitive set of small-sized pattern elements and exposing a second pattern comprising a set of large-sized pattern elements on the at least one exposure area on top of the first pattern, wherein the elements of the first and second patterns partly overlap and form an alignment mark comprising a set of repetitive large-sized pattern elements, such that the edges of the large-sized pattern elements in the direction of repetition are formed by the small-sized pattern elements when properly aligned;

when the projection system is in a heated condition, repeating the first exposing; and determining information about the distortion of the alignment marks as a function of a temperature of at least a portion of the projection system.

18. The method of claim 17, further comprising adapting characteristics of the projection system as the function of the temperature based on the determined information about the distortion.

19. The method of claim 17, wherein the first and second patterns are provided in one or more scribe lanes between exposure fields of the substrate.

20. The method of claim 17, further comprising:
forming the first pattern of the small sized pattern elements in one of the scribe lanes of a first field of a substrate;
forming the second pattern of the large-sized pattern elements in an opposite scribe lane of the first field; and
repeating the forming of the first and second patterns in the scribe lanes of a second field of the substrate, the second field abutting the first field so that the pattern provided in one of the scribe lanes of the first field overlaps the pattern provided in one of the scribe lanes of the second field.

21. The method of claim 11, further comprising:
irradiating the first and second sets of alignment marks; and
detecting the relative displacement between the first and second sets of alignment marks.

22. A device manufacturing method comprising:
transferring a first pattern on at least one exposure area of a layer of a substrate, the first pattern comprising a repetitive set of elements having a first element size; and
transferring a second pattern on the at least one exposure area on top of the first pattern, the second pattern comprising a repetitive set of elements of a second element size, the second element size being different from the first element size, and either small-size pattern elements or large-size pattern elements, wherein the elements of the first and second patterns partly overlap and form an alignment mark comprising a set of repetitive large-sized pattern elements, such that the edges of the large-sized pattern elements in the direction of repetition are formed by small-sized pattern elements when properly aligned.

23. A lithographic apparatus arranged to provide a pattern of alignment marks from a patterning device onto a substrate, wherein the apparatus is configured to:
expose a first pattern on at least one exposure area of a layer of the substrate, the first pattern comprising a repetitive set of elements having a first element size; and
expose a second pattern on the at least one exposure area on top of the first pattern, the second pattern comprising a repetitive set elements of a second element size, the second element size being different from the first element size, and either small-size pattern elements or large-size pattern elements, wherein the elements of the first and second patterns partly overlap and form an alignment mark comprising a set of repetitive large-sized pattern elements, such that the edges of the large-sized pattern elements in the direction of repetition are formed by small-sized pattern elements when properly aligned.

* * * * *